US 10,304,924 B2

(12) United States Patent
Wada

(10) Patent No.: US 10,304,924 B2
(45) Date of Patent: May 28, 2019

(54) SEMICONDUCTOR DEVICE AND METHOD FOR MANUFACTURING SAME

(71) Applicants: Kabushiki Kaisha Toshiba, Minato-ku, Tokyo (JP); Toshiba Electronic Devices & Storage Corporation, Minato-ku, Tokyo (JP)

(72) Inventor: Ryo Wada, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 22 days.

(21) Appl. No.: 15/830,682

(22) Filed: Dec. 4, 2017

(65) Prior Publication Data

US 2018/0350899 A1    Dec. 6, 2018

(30) Foreign Application Priority Data

Jun. 2, 2017  (JP) .................................. 2017-110049

(51) Int. Cl.
| | |
|---|---|
| *H01L 29/06* | (2006.01) |
| *H01L 21/22* | (2006.01) |
| *H01L 29/73* | (2006.01) |
| *H01L 29/78* | (2006.01) |
| *H01L 21/324* | (2006.01) |
| *H01L 29/861* | (2006.01) |
| *H01L 29/739* | (2006.01) |

(52) U.S. Cl.
CPC .......... *H01L 29/063* (2013.01); *H01L 21/221* (2013.01); *H01L 21/324* (2013.01); *H01L 29/7394* (2013.01); *H01L 29/7824* (2013.01); *H01L 29/861* (2013.01)

(58) Field of Classification Search
CPC ... H01L 29/063; H01L 21/221; H01L 21/324; H01L 29/7394; H01L 29/7824; H01L 29/861
USPC ........................................................ 257/493
See application file for complete search history.

(56) References Cited

U.S. PATENT DOCUMENTS

| | | | | |
|---|---|---|---|---|
| 5,773,868 | A | 6/1998 | Endo | |
| 6,150,697 | A * | 11/2000 | Teshigahara | H01L 21/76264 257/335 |
| 8,502,344 | B2 * | 8/2013 | Lu | H01L 29/0696 257/557 |
| 2008/0237631 | A1 * | 10/2008 | Watanabe | H01L 27/1203 257/141 |
| 2011/0291157 | A1 * | 12/2011 | Takahashi | H01L 29/0696 257/144 |
| 2012/0032313 | A1 * | 2/2012 | Yamamoto | H01L 27/0664 257/657 |

(Continued)

FOREIGN PATENT DOCUMENTS

| | | |
|---|---|---|
| JP | H2-280380 A | 11/1990 |
| JP | H8-274351 A | 10/1996 |

(Continued)

*Primary Examiner* — Didarul A Mazumder
(74) *Attorney, Agent, or Firm* — White & Case LLP

(57) ABSTRACT

According to one embodiment, a hydrogen concentration of a bottom part in a vicinity of a boundary with the insulating layer in the first silicon layer is higher than a hydrogen concentration of a part above the bottom part in the first silicon layer. And a resistivity of the bottom part in the first silicon layer is lower than a resistivity of the part above the bottom part in the first silicon layer.

14 Claims, 7 Drawing Sheets

(56) References Cited

U.S. PATENT DOCUMENTS

| | | | |
|---|---|---|---|
| 2012/0119318 A1* | 5/2012 | Tokura ................ | H01L 29/0696 257/489 |
| 2014/0312384 A1* | 10/2014 | Wada .................. | H01L 29/7394 257/141 |
| 2015/0270333 A1* | 9/2015 | Yang .................... | H01L 29/063 257/337 |

FOREIGN PATENT DOCUMENTS

| | | |
|---|---|---|
| JP | H9-270513 A | 10/1997 |
| JP | H11-74492 A | 3/1999 |

* cited by examiner

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2017-110049, filed on Jun. 2, 2017; the entire contents of which are incorporated herein by reference.

FIELD

Embodiments described herein relate generally to a semiconductor device and a method for manufacturing a semiconductor device.

BACKGROUND

In the high-breakdown-voltage lateral diode using a bonded SOI (Silicon On Insulator) wafer, the thicker the silicon active layer is, the higher the breakdown voltage is, but has a problem that the thicker the silicon active layer is, the more the carriers in conduction state increase, and the more the reverse recovery charge Qrr increases in a trade-off relation.

DETAILED DESCRIPTION

Figure 1A:
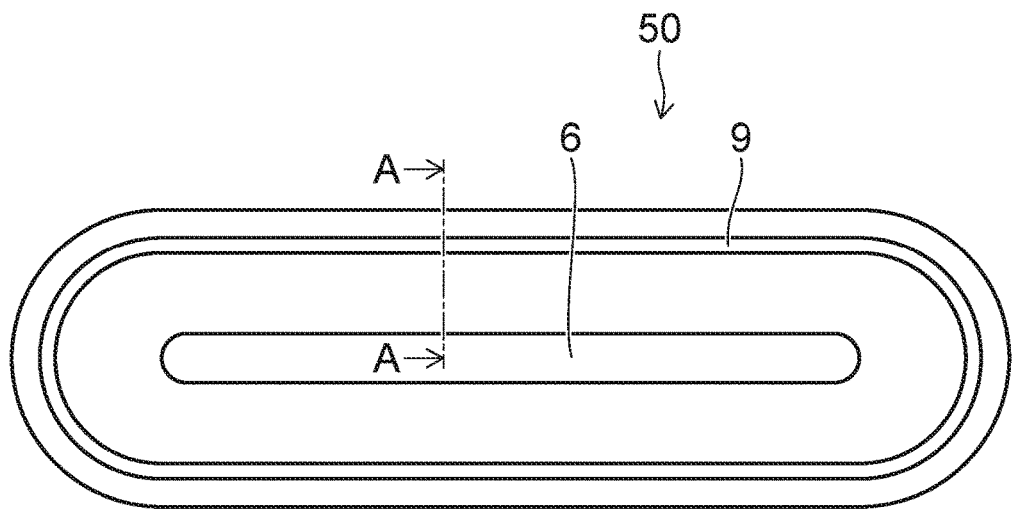
FIG. 1A is a schematic plan view of a semiconductor device according to an embodiment.

According to one embodiment, a semiconductor device includes a substrate, an insulating layer provided on the substrate, a first silicon layer having a first conductivity type provided on the insulating layer, a first semiconductor region having the first conductivity type provided on a surface of the first silicon layer, a second semiconductor region having a second conductivity type or the first conductivity type provided on the surface of the first silicon layer so as to be separated from the first semiconductor region, a first electrode connected to the first semiconductor region, and a second electrode connected to the second semiconductor region. A hydrogen concentration of a bottom part in a vicinity of a boundary with the insulating layer in the first silicon layer is higher than a hydrogen concentration of a part above the bottom part in the first silicon layer. And a resistivity of the bottom part in the first silicon layer is lower than a resistivity of the part above the bottom part in the first silicon layer.

The embodiment will hereinafter be described with reference to the drawings. It should be noted that in the drawings, the same elements are denoted by the same reference symbols.

Although in the following embodiment, the description will be presented assuming a first conductivity type as n-type and a second conductivity type as p-type, it is also possible to assume the first conductivity type as p-type and the second conductivity type as n-type.

Further, in the following embodiment, the impurity concentration can be replaced with the carrier concentration in the description.

FIG. 1A is a schematic plan view of a semiconductor device 50 according to the embodiment.

Figure 1B:
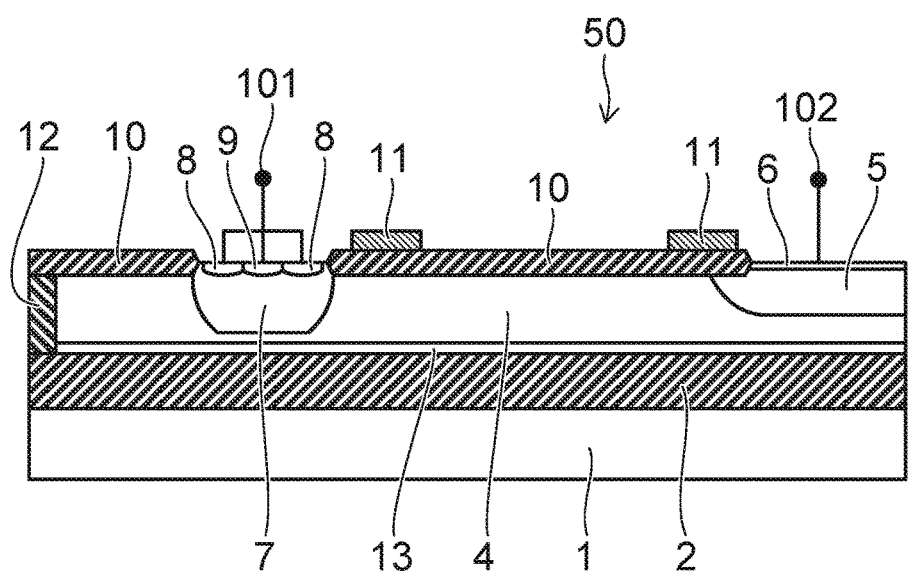
FIG. 1B is an A-A cross-sectional view in FIG. 1A.

FIG. 1B is an A-A cross-sectional view in FIG. 1A.

The semiconductor device 50 has, for example, a lateral FRD (Fast Recovery Diode) structure obtained using the bonded SOI (Silicon On Insulator) wafer.

As shown in FIG. 1B, the semiconductor device 50 has a substrate (a support body) 1, an insulating layer 2 provided on the substrate 1, and a drift layer 4 provided on the insulating layer 2.

The substrate 1 is a silicon substrate, the insulating layer 2 is a silicon oxide layer, and the drift layer 4 is an n-type silicon layer.

A base region 7 as a p-type silicon region, and a buffer region 5 as an n-type silicon region are provided in the drift layer 4. The base region 7 and the buffer region 5 are separated in a lateral direction (a direction parallel to a principal surface of the substrate 1) from each other.

A cathode region 6 as an n-type silicon region is provided on the surface of the buffer region 5. The n-type impurity concentration of the cathode region 6 is higher than the n-type impurity concentration of the drift layer 4. The buffer region 5 has n-type impurity concentration between the n-type impurity concentration of the cathode region 6 and the n-type impurity concentration of the drift layer 4.

An anode region 9 as a p-type silicon region, and contact regions 8 as n-type silicon regions are provided on the surface of the base region 7. The p-type impurity concentration of the anode region 9 is higher than the p-type impurity concentration of the base region 7.

As shown in FIG. 1A, the anode region 9 continuously surrounds the cathode region 6.

Insulating films 10 are provided on the surface of the drift layer 4. Electrodes 11 for relaxing an electrical field on the surface side of the drift layer 4 are provided on the insulating film 10. The electrodes 11 are each formed of, for example, polycrystalline silicon.

The surface of the cathode region 6 is exposed from the insulating film 10 and is connected to a cathode electrode 102 made of metal provided on the cathode region 6.

The anode region 9 and the contact regions 8 are exposed from the insulating film 10, and are connected to an anode electrode 101 made of metal provided on the anode region 9 and the contact regions 8.

A defective layer (a low-resistivity layer) 13 is provided in the bottom part of the drift layer 4 in the vicinity of the boundary with the insulating layer 2. After forming the elements shown in FIG. 1B, the bottom part of the drift layer 4 is irradiated with hydrogen ions or helium ions from the surface side (the surface side of the drift layer 4) of the wafer as described later.

Due to the irradiation with the ions, the crystal defects are formed in the bottom part of the drift layer 4. Therefore, the defect density of the defective layer 13 is higher than the defect density of the part (the silicon region) above the defective layer 13.

The hydrogen concentration of the defective layer 13 is higher than the hydrogen concentration of the part above the defective layer 13 in the drift layer 4. The helium concentration of the defective layer 13 is higher than the helium concentration of the part above the defective layer 13 in the drift layer 4. The concentration (atoms/cm$^3$) can be analyzed by, for example, SIMS (Secondary Ion Mass Spectrometry).

The hydrogen ions or the helium ions injected into the bottom part (the defective layer 13) of the drift layer 4 function as dopants, and the impurity concentration (the hydrogen concentration or the helium concentration) in the defective layer 13 becomes higher than the impurity concentration of the part above the defective layer 13 in the drift layer 4. Therefore, the resistivity of the defective layer 13 is lower than the resistivity of the part above the defective layer 13 in the drift layer 4. This can be analyzed using, for example, SRA (Spreading Resistance Analysis).

Figure 5A:
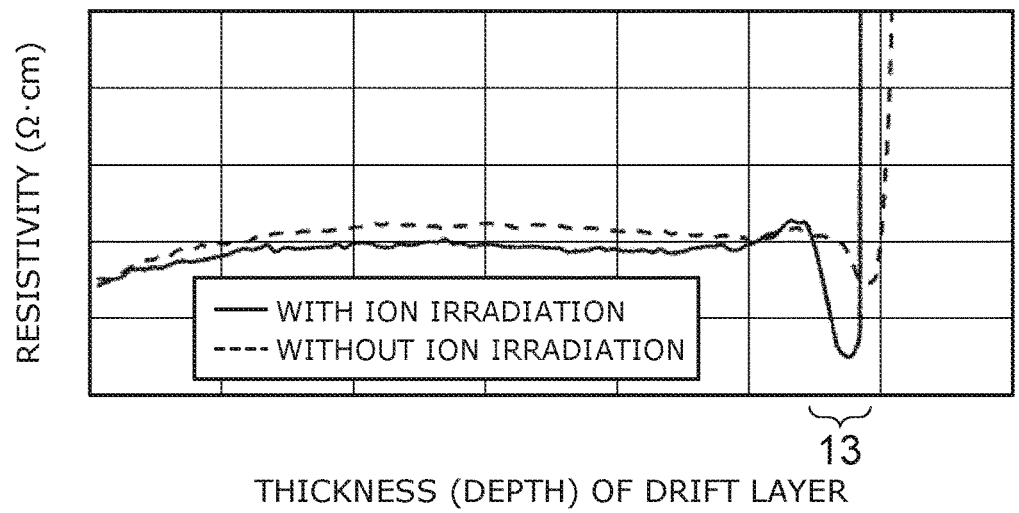
FIG. 5A is a graph showing a resistivity in a depth direction of a drift layer of the semiconductor device according to the embodiment.

FIG. 5A is a graph showing an experimental result of the measurement of the resistivity (Ω·cm) in the thickness (the depth from the surface) direction of the drift layer 4.

The solid line represents the case (the embodiment) in which the ion (helium ion) irradiation has been performed on the bottom part of the drift layer 4 as described above. The dotted line represents the case (a comparative example) in which the ion irradiation has not been performed.

According to the embodiment, due to the ion irradiation described above, the resistivity in the bottom part (the defective layer 13) of the drift layer 4 can be made lower compared to the comparative example as shown in FIG. 5A. The drift layer 4 has a minimum value of the resistivity in the defective layer 13.

Figure 4A:
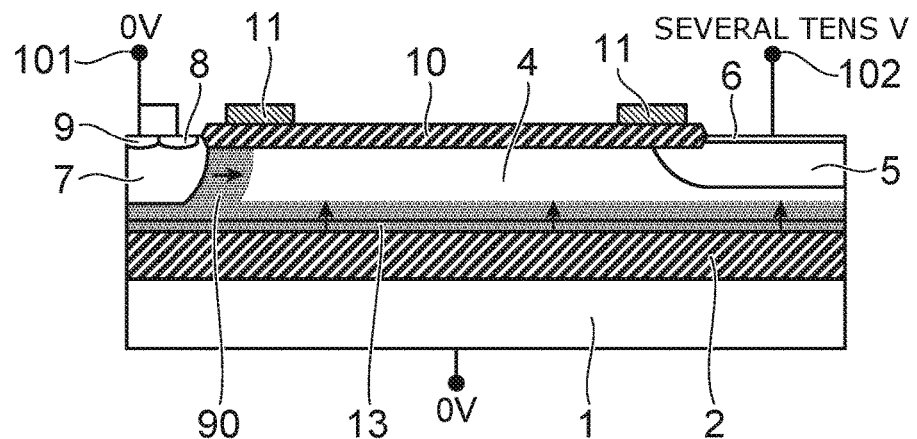
FIGS. 4A and 4B are schematic cross-sectional views showing an extension of a depletion layer during a reverse bias period in the semiconductor device shown in FIGS. 1A and 1B.
Figure 4B:
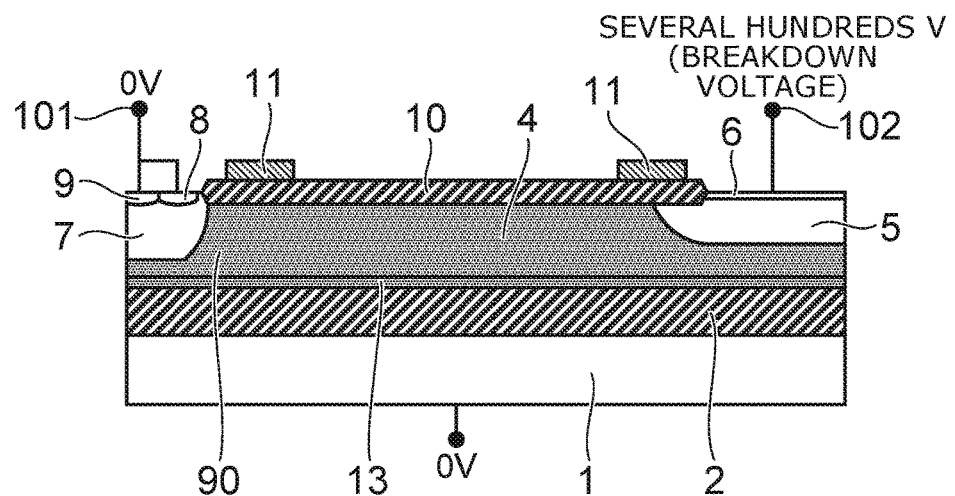

FIGS. 4A and 4B are schematic cross-sectional views showing the extension of a depletion layer during a reverse bias period in the semiconductor device (FRD) 50 shown in FIGS. 1A and 1B. A depletion layer 90 is schematically shown in gray.

When the reverse bias is applied to the semiconductor device (FRD) 50, 0 V is applied to the anode electrode 101 and the substrate 1. Further, as the potential (the anode potential) applied to the cathode electrode 102 rises, the depletion layer 90 extends (expands) from the p-n junction between the base region 7 and the drift layer 4, and the boundary between the drift layer 4 and the insulating layer 2. The drift layer 4 is completely depleted with the anode potential of, for example, several hundreds of volts.

The breakdown voltage is determined by the voltage applied to the depletion layer 90 in the case in which the drift layer 4 has completely been depleted. According to the embodiment, by raising the impurity concentration of the bottom part (the defective layer 13) of the drift layer 4, it is possible to suppress the extension of the depletion layer from the boundary between the drift layer 4 and the insulating layer 2. This delays the complete depletion of the drift layer 4 to increase the breakdown voltage.

Figure 5B:
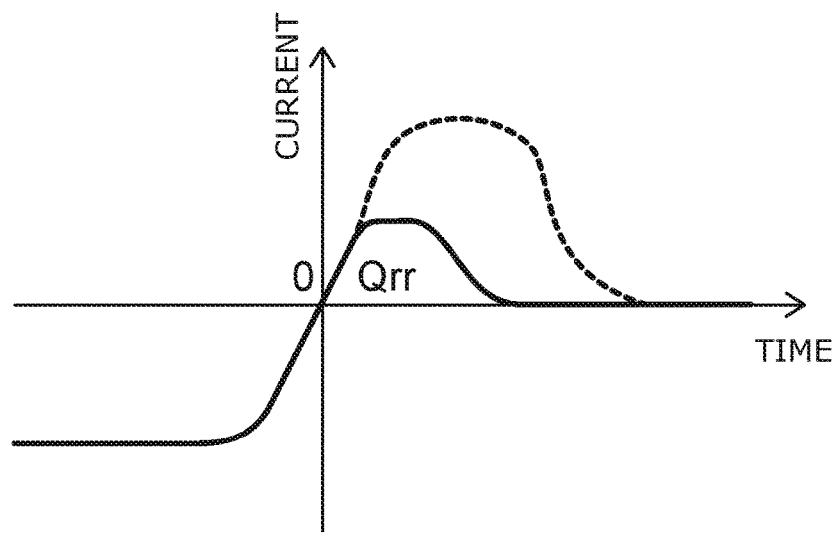
FIG. 5B is a reverse recovery current waveform chart when turning off a lateral diode.

FIG. 5B is a reverse recovery current waveform chart based on the experimental result when turning off the semiconductor device (FRD) 50. The solid line represents the case (the embodiment) in which the ion (helium ion) irradiation has been performed on the bottom part of the drift layer 4 as described above. The dotted line represents the case (the comparative example) in which the ion irradiation has not been performed.

A reverse recovery charge Qrr depends on the number of carriers accumulated in the drift layer 4 during a forward bias period, and the lifetime of the carriers. If the reverse recovery charge Qrr is high, the turnoff is delayed, and the loss increases in particular for the purpose of driving a motor and so on. Therefore, it is desirable to decrease the reverse recovery charge Qrr as much as possible.

According to the embodiment, due to the irradiation with the hydrogen ions or the helium ions, the defective layer 13 is formed in the bottom part of the drift layer 4 to thereby form a recombination center of the carriers in the defective layer 13, and thus, it is possible to make the carrier lifetime shorter to thereby make the reverse recovery charge Qrr lower than in the comparative example. This increases the turnoff speed.

Figure 2A:
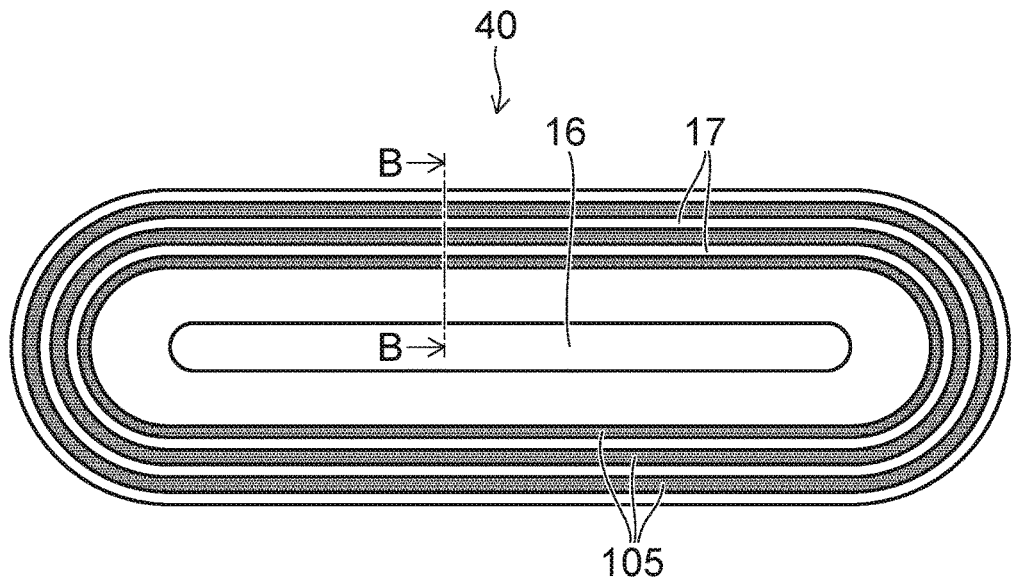
FIG. 2A is a schematic plan view of a semiconductor device according to another embodiment.

FIG. 2A is a schematic plan view of a semiconductor device 40 according to another embodiment.

Figure 2B:
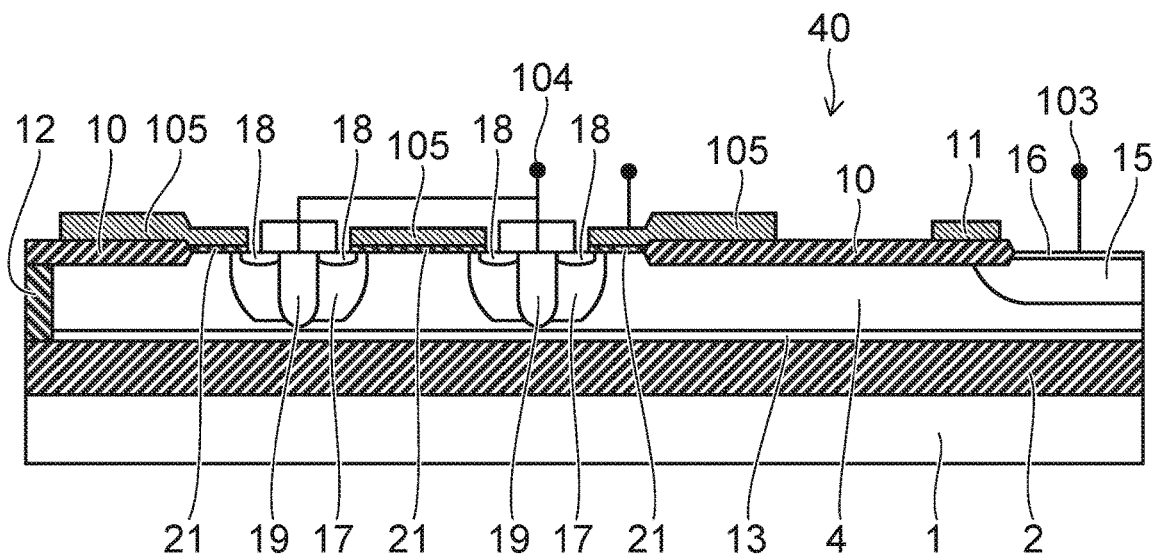
FIG. 2B is a B-B cross-sectional view in FIG. 2A.

FIG. 2B is a B-B cross-sectional view in FIG. 2A.

The semiconductor device 40 has a lateral IGBT (Insulated Gate Bipolar Transistor) structure. Similarly to the semiconductor device (FRD) 50 shown in FIGS. 1A and 1B, the semiconductor device 40 also has an SOI structure including the substrate 1, the insulating layer 2 provided on the substrate 1, and the drift layer 4 provided on the insulating layer 2.

Base regions 17 as p-type silicon regions, and a buffer region 15 as an n-type silicon region are provided in the drift layer 4. The base regions 17 and the buffer region 15 are separated in a lateral direction (a direction parallel to the principal surface of the substrate 1) from each other.

A collector region 16 as a p-type silicon region is provided on the surface of the buffer region 15. The p-type impurity concentration of the collector region 16 is higher than the p-type impurity concentration of the base regions 17.

An emitter region 18 as an n-type silicon region is provided on the surface of each of the base regions 17. The n-type impurity concentration of the emitter region 18 is higher than the n-type impurity concentration of the drift layer 4.

A contact region 19 as a p-type silicon region is provided also between the base regions 17. The p-type impurity concentration of the contact region 19 is higher than the p-type impurity concentration of the base regions 17.

As shown in FIG. 2A, the base regions 17 continuously surround the collector region 16.

The insulating films 10 are provided on the surface of the drift layer 4. The electrode 11 for relaxing the electrical field on the surface side of the drift layer 4 is provided on the insulating film 10.

The surface of the collector region 16 is exposed from the insulating film 10 and is connected to a collector electrode 103 made of metal provided on the collector region 16.

The emitter regions 18 and the contact region 19 are exposed from the insulating films 10, and are connected to an emitter electrode 104 made of metal provided on the emitter regions 18 and the contact region 19.

Gate electrodes 105 is provided, via gate insulating films 21, on the surfaces of the base regions 17 (the base regions 17 between the emitter regions 18 and the drift layer 4) adjacent to the respective emitter regions 18, and on the surface of the drift layer 4 adjacent to the respective base regions 17. The gate electrodes 105 are formed of, for example, polycrystalline silicon. A part of the gate electrode 105 also extends on the insulating film 10, and also functions as the electrode 11.

As shown in FIG. 2A, the gate electrodes 105 continuously surround the collector region 16.

A voltage is applied between the collector electrode 103 and the emitter electrode 104. The potential applied to the collector electrode 103 is higher than the potential applied to the emitter electrode 104. During the ON operation period of the IGBT, a potential equal to or higher than a threshold value is applied to the gate electrode 105, and a reverse layer (an n-type channel) is formed in each of regions opposed to the gate electrodes 105 in the base regions 17. Further, a current flows between the collector electrode 103 and the emitter electrode 104 through the collector region 16, the buffer region 15, the drift layer 4, the channels, and the emitter regions 18. On this occasion, the holes are supplied from the p-type collector region 16 to the drift layer 4, and the high density state of the electrons and the holes is created in the drift layer 4, and a low ON-resistance can be obtained.

In this semiconductor device (IGBT) 40, the defective layer 13 is provided in the bottom part of the drift layer 4 in the vicinity of the boundary with the insulating layer 2. Therefore, in the semiconductor device (IGBT) 40, it is also possible to delay the complete depletion of the drift layer 4 to increase the breakdown voltage during the turnoff period. Further, it is possible to shorten the carrier lifetime due to the defective layer 13 to reduce the reverse recovery charge Qrr to thereby increase the turnoff speed.

Figure 3A:
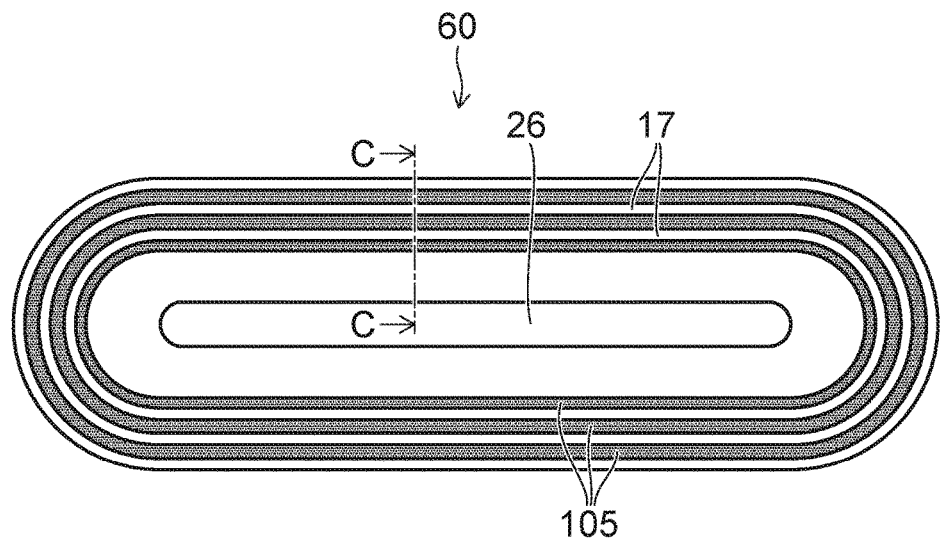
FIG. 3A is a schematic plan view of a semiconductor device according to still another embodiment.

FIG. 3A is a schematic plan view of a semiconductor device 60 according to still another embodiment.

Figure 3B:
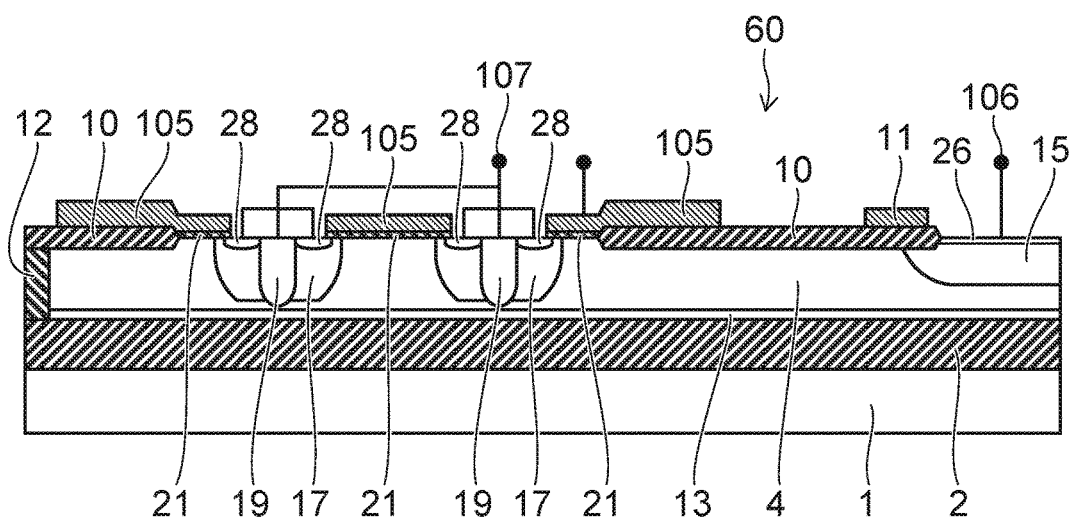
FIG. 3B is a C-C cross-sectional view in FIG. 3A.

FIG. 3B is a C-C cross-sectional view in FIG. 3A.

The semiconductor device 60 has a lateral MOSFET (Metal-Oxide-Semiconductor Field Effect Transistor) structure. The semiconductor device 60 also has the SOI structure including the substrate 1, the insulating layer 2 provided on the substrate 1, and the drift layer 4 provided on the insulating layer 2.

Base regions 17 as p-type silicon regions, and the buffer region 15 as an n-type silicon region are provided in the drift layer 4. The base regions 17 and the buffer region 15 are separated in the lateral direction (the direction parallel to the principal surface of the substrate 1) from each other.

A drain region 26 as an n-type silicon region is provided on the surface of the buffer region 15. The n-type impurity concentration of the drain region 26 is higher than the n-type impurity concentration of the drift layer 4. The buffer region 15 has n-type impurity concentration between the n-type impurity concentration of the drain region 26 and the n-type impurity concentration of the drift layer 4.

A source region 28 as an n-type silicon region is provided on the surface of each of the base regions 17. The n-type impurity concentration of the source regions 28 is higher than the n-type impurity concentration of the drift layer 4.

A contact region 19 as a p-type silicon region is provided between the base regions 17. The p-type impurity concentration of the contact region 19 is higher than the p-type impurity concentration of the base regions 17.

As shown in FIG. 3A, the base regions 17 continuously surround the drain region 26.

The insulating films 10 are provided on the surface of the drift layer 4. The electrode 11 for relaxing the electrical field on the surface side of the drift layer 4 is provided on the insulating film 10.

The surface of the drain region 26 is exposed from the insulating film 10 and is connected to a drain electrode 106 made of metal provided on the drain region 26.

The source regions 28 and the contact region 19 are exposed from the insulating films 10, and are connected to a source electrode 107 made of metal provided on the source regions 28 and the contact region 19.

Gate electrodes 105 are provided, via the gate insulating films 21, on the surfaces of the base regions 17 (the base regions 17 between the source regions 28 and the drift layer 4) adjacent to the respective source regions 28, and on the surface of the drift layer 4 adjacent to the respective base regions 17. The gate electrodes 105 are formed of, for example, polycrystalline silicon. A part of the gate electrode 105 also extends on the insulating film 10, and also functions as the electrode 11.

As shown in FIG. 3A, the gate electrodes 105 continuously surround the drain region 26.

A voltage is applied between the drain electrode 106 and the source electrode 107. The potential applied to the drain electrode 106 is higher than the potential applied to the source electrode 107. During the ON operation period of the MOSFET, a potential equal to or higher than a threshold value is applied to the gate electrode 105, and a reverse layer (an n-type channel) is formed in each of regions opposed to the gate electrodes 105 in the base regions 17. Further, a current flows between the drain electrode 106 and the source electrode 107 through the drain region 26, the buffer region 15, the drift layer 4, the channels, and the source regions 28.

In this semiconductor device (MOSFET) 60, the defective layer 13 is also provided in the bottom part of the drift layer 4 in the vicinity of the boundary with the insulating layer 2. Therefore, in the semiconductor device (MOSFET) 60, it is also possible to delay the complete depletion of the drift layer 4 to increase the breakdown voltage during the turnoff period. Further, it is possible to shorten the carrier lifetime due to the defective layer 13 to reduce the reverse recovery charge Qrr to thereby increase the turnoff speed.

As described hereinabove, according to the embodiment, it is possible to raise the breakdown voltage without thickening the drift layer 4, and to reduce the reverse recovery charge Qrr in each of the elements of FRD, IGBT, and MOSFET.

Figure 6A:
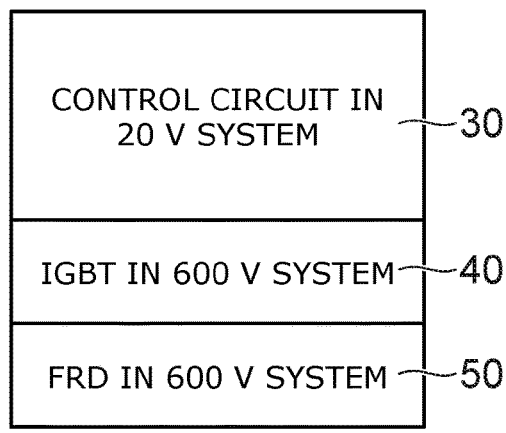
FIGS. 6A and 6B are schematic diagrams of an in-chip configuration of the semiconductor device according to the embodiment.
Figure 6B:
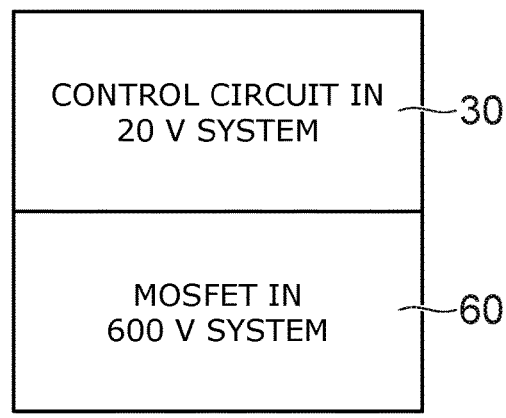

FIGS. 6A and 6B are each a schematic diagram of an in-chip configuration of a semiconductor device according to an embodiment.

According to the semiconductor device shown in FIG. 6A, a control circuit 30, the IGBT 40 shown in FIGS. 2A and 2B, and the FRD 50 shown in FIGS. 1A and 1B are integrally consolidated in a single chip. The control circuit 30, the IGBT 40, and the FRD 50 are formed in the common SOI wafer. These elements are isolated from each other with the insulating films (e.g., embedded silicon oxide films) 12, and the insulating layer 2 shown in FIG. 1B, FIG. 2B, and FIG. 7.

The control circuit 30 is, for example, an IC (Integrated Circuit) including a CMOS circuit. The control circuit 30 controls the gate potential of the IGBT 40 or the MOSFET 60.

According to the semiconductor device shown in FIG. 6B, the control circuit 30, and the MOSFET 60 shown in FIGS. 3A and 3B are integrally consolidated in a single chip. The control circuit 30 and the MOSFET 60 are formed in the common SOI wafer. These elements are isolated from each other with the insulating films (e.g., embedded silicon oxide films) 12, and the insulating layer 2 shown in FIG. 3B and FIG. 7.

For example, the breakdown voltage of the control circuit 30 is 20 V, the breakdown voltage of the IGBT is 600 V, the breakdown voltage of the FRD is 600 V, and the breakdown voltage of the MOSFET is 600 V.

The semiconductor device having a chip configuration shown in FIG. 6A or FIG. 6B can be used as a driver for driving, for example, a motor.

Figure 7:
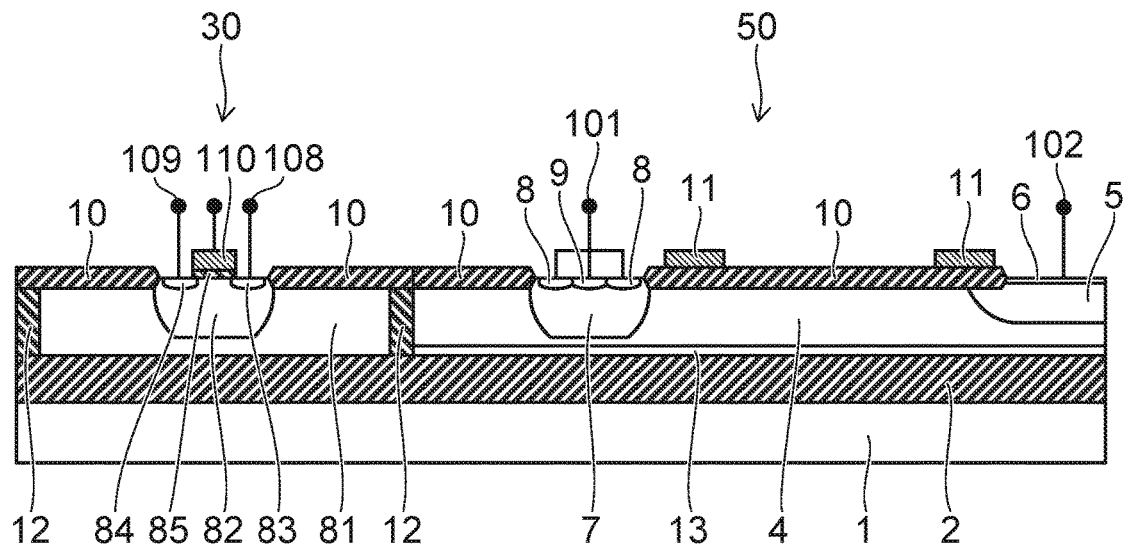
FIG. 7 is a schematic cross-sectional view of a semiconductor device according to the embodiment.

FIG. 7 is a schematic cross-sectional view of a part in which, for example, the FRD 50 and the control circuit 30 are consolidated.

A silicon layer 81 is provided on the insulating layer 2 in the region where the control circuit 30 is formed. A base region 82 is formed in the silicon layer 81, and a drain region 83 and a source region 84 are formed on the surface of the base region 82.

FIG. 7 shows one MOSFET in the CMOS of the control circuit 30. In the case of the n-channel MOSFET, the base region 82 is a p-type silicon region, and the drain region 83 and the source region 84 are each an n-type silicon region. In the case of the p-channel MOSFET, the base region 82 is an n-type silicon region, and the drain region 83 and the source region 84 are each a p-type silicon region.

A gate electrode 110 is provided, via a gate insulating film 85, on the surface of the base region 82 between the drain region 82 and the source region 84.

The insulating films 10 are disposed on the surface of the silicon layer 81. The drain region 83 is exposed from the insulating film 10, and is connected to a drain electrode 108 made of metal provided on the drain region 83. The source region 84 is exposed from the insulating film 10 and is connected to a source electrode 109 made of metal provided on the source region 84.

The ion irradiation is not performed on the bottom part on the insulating layer 2 side in the silicon layer 81 of the control circuit 30, and therefore, the defective layer is not formed. The hydrogen concentration of the bottom part in the vicinity of the boundary with the insulating layer 2 in the silicon layer 81 is lower than the hydrogen concentration of the bottom part (the defective layer 13) in the vicinity of the boundary with the insulating layer 2 in the drift layer 4. The helium concentration of the bottom part in the vicinity of the boundary with the insulating layer 2 in the silicon layer 81 is lower than the helium concentration of the bottom part (the defective layer 13) in the vicinity of the boundary with the insulating layer 2 in the drift layer 4.

The elements (except the defective layer 13) shown in FIG. 7 are formed in the wafer state using, for example, the bonded SOI technology.

The drift layer 4 of the FRD 50 and the silicon layer 81 of the control circuit 30 are formed at the same time. The insulating film 12 is provided between the drift layer 4 of the FRD 50 and the silicon layer 81 of the control circuit 30.

For example, the p-type base region 82 of the n-channel MOSFET of the control circuit 30 and the p-type base region 7 of the FRD 50 are formed at the same time. For example, the n-type drain region 83 of the n-channel MOSFET of the control circuit 30 and the n-type contact region 8 of the FRD 50 are formed at the same time. For example, the p-type drain region 83 of the p-channel MOSFET of the control circuit 30 and the p-type anode 9 of the FRD 50 are formed at the same time.

Annealing for activating the impurities injected for forming the silicon regions has already been performed before forming the defective layer 13.

Figure 8:
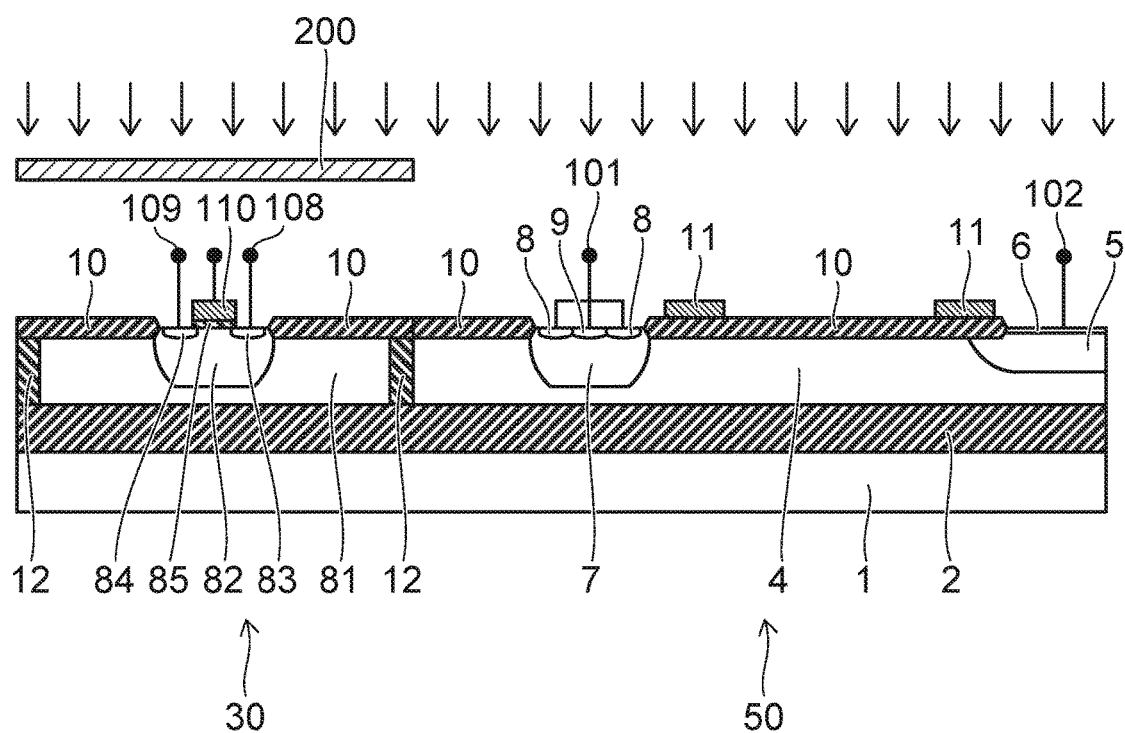
FIG. 8 is a schematic cross-sectional view showing a method of manufacturing the semiconductor device shown in FIG. 7.

After forming the elements (except the defective layer 13) shown in FIG. 7, a mask 200 made of, for example, aluminum is set on the obverse surface side of the wafer as shown in FIG. 8. The mask 200 covers the region where the control circuit 30 is formed. In this state, the irradiation with the hydrogen ions or the helium ions is performed from the obverse surface side of the wafer toward the bottom part of the drift layer 4. The defective layer 13 is formed in the bottom part of the drift layer 4 of the FRD as shown in FIG. 7.

The part where the control circuit 30 is formed is shielded by the mask 200, and therefore, the ions are injected into the part where the control circuit 30 is formed. Therefore, the defective layer is not formed in the silicon layer 81 of the control circuit 30.

Subsequently, the mask 200 is removed to perform annealing. The annealing is performed at the temperature (temperature lower than 400° C.) at which the crystalline defects of the defective layer 13 formed by the irradiation with the hydrogen ions or the helium ions described above are not recovered. For example, the annealing is performed at 380° C.

After the annealing, the back side (the back side of the substrate 1) of the wafer is ground to be thinner. Subsequently, the wafer is diced to be singulated into a plurality of chips.

In the IGBT 40 shown in FIG. 2B and the MOSFET 60 shown in FIG. 3B, the defective layer 13 is also formed similarly to the FRD 50.

Specifically, the elements (except the defective layer 13) shown in FIG. 2B or FIG. 3B are formed, then the region where the control circuit 30 is formed is shielded by a mask, and then the bottom part of the drift layer 4 is irradiated with the hydrogen ions or the helium ions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a substrate;
   an insulating layer provided on the substrate;
   a first silicon layer having a first conductivity type provided on the insulating layer;
   a first semiconductor region having the first conductivity type provided on a surface of the first silicon layer;
   a second semiconductor region having a second conductivity type or the first conductivity type provided on the surface of the first silicon layer so as to be separated from the first semiconductor region;
   a first electrode connected to the first semiconductor region; and
   a second electrode connected to the second semiconductor region,
   a hydrogen concentration of a bottom part in a vicinity of a boundary with the insulating layer in the first silicon layer being higher than a hydrogen concentration of a part above the bottom part in the first silicon layer, and
   a resistivity of the bottom part in the first silicon layer being lower than a resistivity of the part above the bottom part in the first silicon layer.

2. The device according to claim 1, wherein the second semiconductor region continuously surrounds the first semiconductor region.

3. The device according to claim 1, further comprising:
a first base region having the second conductivity type provided between the first semiconductor region and the first silicon layer;
a first gate electrode provided on the first base region; and
a first gate insulating film provided between the first base region and the first gate electrode.

4. The device according to claim 3, wherein
the first base region continuously surrounds the second semiconductor region.

5. The device according to claim 3, wherein
the first gate electrode continuously surrounds the second semiconductor region.

6. The device according to claim 1, further comprising:
a second silicon layer provided on the insulating layer;
an insulating film provided between the first silicon layer and the second silicon layer;
a second base region provided in the second silicon layer;
a drain region provided on a surface of the second base region;
a source region provided on the surface of the second base region so as to be separated from the drain region;
a second gate electrode provided on the second base region between the drain region and the source region; and
a second gate insulating film provided between the second base region and the second gate electrode.

7. The device according to claim 6, wherein
a hydrogen concentration of a bottom part in a vicinity of a boundary with the insulating layer in the second silicon layer is lower than the hydrogen concentration of the bottom part in the vicinity of the boundary with the insulating layer in the first silicon layer.

8. A semiconductor device comprising:
a substrate;
an insulating layer provided on the substrate;
a first silicon layer having a first conductivity type provided on the insulating layer;
a first semiconductor region having the first conductivity type provided on a surface of the first silicon layer;
a second semiconductor region having a second conductivity type or the first conductivity type provided on the surface of the first silicon layer so as to be separated from the first semiconductor region;
a first electrode connected to the first semiconductor region; and
a second electrode connected to the second semiconductor region,
a helium concentration of a bottom part in a vicinity of a boundary with the insulating layer in the first silicon layer being higher than a helium concentration of a part above the bottom part in the first silicon layer, and
a resistivity of the bottom part in the first silicon layer being lower than a resistivity of the part above the bottom part in the first silicon layer.

9. The device according to claim 8, wherein
the second semiconductor region continuously surrounds the first semiconductor region.

10. The device according to claim 8, further comprising:
a first base region having the second conductivity type provided between the first semiconductor region and the first silicon layer;
a first gate electrode provided on the first base region; and
a first gate insulating film provided between the first base region and the first gate electrode.

11. The device according to claim 10, wherein
the first base region continuously surrounds the second semiconductor region.

12. The device according to claim 10, wherein
the first gate electrode continuously surrounds the second semiconductor region.

13. The device according to claim 8, further comprising:
a second silicon layer provided on the insulating layer;
an insulating film provided between the first silicon layer and the second silicon layer;
a second base region provided in the second silicon layer;
a drain region provided on a surface of the second base region;
a source region provided on the surface of the second base region so as to be separated from the drain region;
a second gate electrode provided on the second base region between the drain region and the source region; and
a second gate insulating film provided between the second base region and the second gate electrode.

14. The device according to claim 13, wherein
a helium concentration of a bottom part in a vicinity of a boundary with the insulating layer in the second silicon layer is lower than a helium concentration of the bottom part in the vicinity of the boundary with the insulating layer in the first silicon layer.

\* \* \* \* \*